United States Patent
Gannon (10) Patent No.: US 6,344,748 B1
(45) Date of Patent: Feb. 5, 2002

(54) COAXIAL CABLE CONNECTOR TESTING METHODS AND APPARATUS

(75) Inventor: Joseph R. Gannon, Chicago, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/511,038

(22) Filed: Feb. 23, 2000

(51) Int. Cl.[7] .............................................. G01R 31/02

(52) U.S. Cl. ........................ 324/542; 324/543; 324/538

(58) Field of Search ................................ 324/527, 542, 324/543, 556, 133, 539, 538

(56) References Cited

U.S. PATENT DOCUMENTS

| | | | |
|---|---|---|---|
| 4,553,085 A | | 11/1985 | Canzano |
| 5,391,991 A | | 2/1995 | Tuttle |
| 5,477,152 A | | 12/1995 | Hayhurst |
| 5,530,367 A | * | 6/1996 | Bottman ..................... 324/616 |
| 5,565,784 A | | 10/1996 | DeRenne |
| 5,667,387 A | | 9/1997 | Klemm |

* cited by examiner

Primary Examiner—Safet Metjahic
Assistant Examiner—Vincent Q. Nguyen
(74) Attorney, Agent, or Firm—Stevens & Showalter LLP (57) ABSTRACT

A terminator plug is connected to one coaxial cable connector and a coaxial cable connection tester is connected to the other cable connector. A voltage is applied to the cable's center conductor and a ground to the cable's shield. The center conductor voltage is monitored for open and short faults while the cable adjacent first one and then the other connector are wiggled. The voltage on the center conductor changes if a continuous short or open is present or if such faults intermittently occur. The voltage on the center conductor is monitored by two comparators with one detecting short faults and the other detecting open faults. The outputs of the comparators are combined to generate an OK signal if no faults are detected. If open faults are detected, the signals from the open comparator are clocked into a flip-flop; if short faults are detected, the signals from the short comparator are clocked into a flip-flop. Outputs from the flip-flops are counted by respective open and short counters and displayed so that the number of intermittent open and short faults, if any, are displayed up to the capacity of the counter and display used, 0-8 for the illustrated embodiment. A buzzer can be used to provide an audible fault signal. A power management circuit powers the circuitry of the tester as demanded and also monitors a battery so that an indication of low battery power can also be signaled.

19 Claims, 3 Drawing Sheets

| | DISPLAY INDICATIONS | BNC CONNECTION | NOTE |
|---|---|---|---|
| 90 | 0-\|  \|-0 | GOOD | NOW OK, NO OPENS, NO SHORTS |
| 92 | 0   .0 | BAD | NOW OPEN, NEVER TERMINATED |
| 94 | 0   .1 | BAD | NOW OPEN |
| 96 | 1.   0 | BAD | NOW SHORTED |
| 98 | 1-\|  \|-0 | BAD | 1 SHORT DURING TEST, NOW OK, NO OPENS |
| 100 | 0-\|  \|-1 | BAD | 1 OPEN DURING TEST, NOW OK, NO SHORTS |
| 102 | 2-\|  \|-4 | BAD | 2 SHORT AND 4 OPEN DURING TEST, NOW OK |
| 104 | 0-\|.\|-0 | | LOW BATTERY |
| 106 | -\|.\|- | | REPLACE BATTERY, DO NOT TEST |

COAXIAL CABLE CONNECTOR TESTING METHODS AND APPARATUS

TECHNICAL FIELD

The present invention relates to a coaxial cable testing and, more particularly, to a coaxial cable testing methods and apparatus that detect intermittent and continuous opens and shorts at junctions between a coaxial cable and terminating coaxial cable connectors. The present invention is generally applicable to all types of connectors for coaxial cables including bayonet coaxial cable (BNC) connectors, threaded connectors and other currently available coaxial cable connectors and connectors which may become available in the future.

BACKGROUND OF THE INVENTION

Currently almost all customers of cable installation require the testing of every coaxial cable connector terminated in the field. To test coaxial cable connectors in the field, an installer can use a simple battery device with current running through the cables including the connector actuating a buzzer, LCDs, LEDs or a combination thereof to indicate opens or shorts. However, with a simple battery device it is very difficult or impossible to catch intermittent fault conditions because intermittent errors are often too short in duration for the buzzer or LCDs/LEDs to give any indication. Further, field installed cables to be tested often extend over hundreds of feet so that some prior art field testing devices require an installer at each end of the cable, one installer on one end of the cable with the testing device in hand in order to see or hear fault indications and the other installer at the other end of the cable to manipulate the coaxial cable connector on the other end of the cable.

In order to reduce this double testing effort, users can use a Bit Error Rate Test Set (BERT) to detect intermittent or continuous problems at the coaxial cable connector coaxial cable junctions. However, a BERT is very expensive and relatively bulkier than the above describe hand held testers making it difficult to transport in the field.

The prior art discloses a number of coaxial cable testing devices. U.S. Pat. No. 4,553,085 to Canzano discloses a coaxial cable tester device which detects shorts and opens in either the center conductor or the ground conductor of a coaxial cable and indicates the defective conductor. U.S. Pat. No. 5,391,991 to Tuttle discloses a cable shield resistance test set that measures degradation in cable shield without the need to disconnect the cable from the circuit. U.S. Pat. No. 5,477,152 to Hayhurst discloses a cable testing device that tests continuity and/or short circuits automatically in a cable. U.S. Pat. No. 5,565,784 to DeRenne discloses a coaxial cable testing and tracing device that allows the continuity of a plurality of coaxial cables to be tested and to individually locate a coaxial cable.

While these devices fulfill their respective, particular objectives and requirements, the aforementioned patents do not disclose, teach or suggest a coaxial cable connector tester that checks for intermittent and continuous opens and shorts at the junction of the coaxial cable connector and coaxial cable.

In this respect, the coaxial cable connector tester device according to the present invention substantially departs from the conventional concepts and designs of the prior art, and in doing so provides an apparatus primarily developed for the purpose of testing for intermittent and continuous opens and shorts at the junction of the coaxial cable connector and the coaxial cable.

Therefore, it can be appreciated that there exists a continuing need for a new and improved coaxial cable connector testing device which can test for intermittent and continuous opens and shorts at the junction between a coaxial cable connector and a coaxial cable.

SUMMARY OF THE INVENTION

This need is met by the coaxial cable connector tester according to the present invention wherein a terminator plug is connected to one connector of a coaxial cable and the connector tester is connected to the other connector. The connector tester applies a voltage to the center conductor of the coaxial cable and a ground to the shield with the voltage at the center conductor being monitored for open and short fault conditions while the cable adjacent first one and then the other connector of the cable are wiggled to test the integrity of the connection of the connectors to the cable. The voltage level on the center conductor changes if either a short or open is present or intermittently occurs during the wiggle operation. To detect shorts and opens, the voltage on the center conductor is monitored by two comparator circuits with one detecting short faults, short comparator, and the other detecting open faults, open comparator. The outputs of the comparator circuits are combined to generate an OK signal if no faults are detected. If open faults are detected, the signals from the open comparator are clocked into a flip-flop and if short faults are detected, the signals from the short comparator are clocked into a flip-flop. Outputs from the flip-flops are counted by respective open and short fault counters and displayed so that the number of intermittent open and short faults, if any, are displayed up to the capacity of the counter and a display used for the tester, 0-8 for the illustrated embodiment. A buzzer can also be used selectively to provide an audible fault signal if desired. A power management circuit provides power to circuitry of the tester as demanded by a user and also monitors a battery so that an indication of low battery power can also be signaled to the user of the tester.

In accordance with one aspect of the present invention, a tester for junctions between a coaxial cable and coaxial cable connectors connected to the coaxial cable to test for intermittent and continuous open circuit and short circuit faults at the junctions comprises a cable terminator plug having a characteristic impedance and being coupled to a first end of a coaxial cable whose junctions are to be tested. An electronic testing circuit having a coaxial cable connector coupled to a second end of the coaxial cable to be tested comprises a test circuit coupled to the coaxial cable connector for detecting open and short circuit faults at one or both of the junctions. The electronic testing circuit generates open fault signals indicating detected open circuit faults, short fault signals indicating detected short faults and a no shorts/no opens signal indicating no detected short or open faults. An open counter coupled to the test circuit counts the open fault signals and a short counter coupled to the test circuit counts the short fault signals. A display circuit displays the counts accumulated in the open counter and the short counter to indicated to a user the number of each type of fault up to the capacity of the counters and the display.

The test circuit may comprise a first comparator coupled to the coaxial cable connector for detecting the open circuit faults and a first storage device responsive to the open circuit faults generates the open fault signals. A second comparator is coupled to the coaxial cable connector for detecting the short circuit faults and a second storage device responsive to the short circuit faults generates the short fault signals. Combination circuitry is coupled to the first and second storage devices for generating the no shorts/no opens signal. The storage devices may comprise flip-flop circuits and the tester may further comprise a battery with the tester being powered by the battery and a power management circuit for controlling power coupled from the battery to the electronic testing circuit. The power management circuit further monitors power of the battery and generates a visual warning displayed by the display circuit if a low power condition exists. Preferably, the power management circuit provides a first low power warning if the power is detected below a first threshold level and a second lower power warning if the power is detected below a second threshold level. For a three volt battery, the first threshold level is approximately 2.6 volts and the second threshold level is approximately 2.45 volts. The power management circuit may comprise an on switch and an off switch and pressing the on switch sets the open counter to a preset value and sets the short counter to a preset level. The preset value for the open counter and the short counter can be equal to zero. The display circuit may be a quad seven segment LCD and may further comprise an audible sounder circuit which generates an audible indication if either the open fault signals or the short fault signals are generated. The audible sounder circuit may comprise a buzzer and may further comprise an on switch and an off switch to turn the buzzer on and off, respectively. In the illustrated embodiment, the electronic testing circuit is accommodated in a tester housing having a window for viewing the display circuit, and including a removable door to insert or remove a power supply battery also accommodated in the tester housing.

In accordance with another aspect of the present invention, a method for testing junctions between a coaxial cable and coaxial cable connectors connected to the coaxial cable for intermittent and continuous open circuit and short circuit faults at the junctions comprises coupling a cable terminator plug having a characteristic impedance to a first end of a coaxial cable whose junctions are to be tested. An electronic testing circuit having a coaxial cable connector is coupled to a second end of the coaxial cable to be tested by coupling a test circuit to the coaxial cable connector to detect open and short circuit faults at one or both of the junctions and to generate open fault signals indicating detected open circuit faults, short fault signals indicating detected short faults and a no shorts/no opens signal indicating no detected short or open faults. A an open counter is coupled to the test circuit for counting the open fault signals, and a short counter is coupled to the test circuit for counting the short fault signals. The counts accumulated in the open counter and the short counter are displayed to the cable installer testing the junctions. The method may further comprise providing a battery to power testing, monitoring power of the battery, and generating a visual warning displayed by a display circuit if a low power condition exists. The step of generating a visual warning may comprise providing a first low power warning if the power is detected below a first threshold level, and providing a second lower power warning if the power is detected below a second threshold level. The method may further comprise providing an audible sounder circuit, and activating the audible sounder circuit to generate an audible indication if either the open fault signals or the short fault signals are generated.

Accordingly, it is an object of the present invention to provide an improved test set that detects intermittent or continuous opens or shorts at the junction of a coaxial cable connector and coaxial cable.

Another object of the present invention is to provided a relatively inexpensive test set that detects intermittent or continuous opens or shorts at the junction of a coaxial cable connector and coaxial cable.

Still another object of the present invention is to provided a test set that detects intermittent or continuous opens or shorts at the junction of a coaxial cable connector and a coaxial cable that is non-bulky and easy to use in the field.

Other objects and advantages of the invention will be apparent from the following detailed description, the accompanying drawings, and the appended claims.

BRIEF DESCRIPTION OF THE DRAWINGS

The same reference numerals refer to the same parts through the various figures.

DETAILED DESCRIPTION OF THE INVENTION

Reference will now be made to the drawings which shows a currently preferred embodiment of the new and improved coaxial cable connector testing device 10 embodying the principles and concepts of the present invention. As illustrated, the present invention comprises a plurality of components. In their broadest context, such components include a coaxial terminator plug 12, a tester housing 14, and an electronic testing circuit 16, see FIGS. 1–3. Such components are individually configured and correlated with respect to each other to provide the intended function of detecting intermittent or continuous opens or shorts at the junction of a coaxial cable connector and a coaxial cable. In particular, the coaxial cable connector testing device 10 is a portable test instrument which electronically tests for intermittent or continuous short and open circuits to detect a damaged or faulty junction between a coaxial cable connector and a coaxial cable. The illustrated hand-held coaxial cable connector testing device 10 is about 6 inches long by 3.5 inches wide by 1 inch thick. The present invention employs digital and analog integrated circuits powered by batteries that are contained in the tester housing 14. The terminator plug 12 is used in conjunction with the electronic testing circuit 16.

Specifically, the terminator plug 12 has a characteristic impedance of 10 kilo ohms. The terminator plug 12 is configured to couple with a first coaxial cable connector 18 that is attached to a first end of a coaxial cable 20. The tester housing 14 is formed of a rigid impact-resistant plastic however other materials can be used. The tester housing 14 includes an upper portion 22 that is removably coupled to a lower portion 24. See FIG. 2. When the portions are coupled together, a hollow interior is defined there between. The upper portion 22 has a contoured top wall 26 with integral and rounded side walls 28 and 30, and a plurality of side grooves 32 and 34 allowing the tester housing 14 to be conveniently held in the palm of a user's hand. The lower portion 24 is substantially the same in shape as the upper portion 22 but includes a removable door 36 coupled thereto for allowing access to the hollow interior of the tester housing 14, for example to insert or remove batteries.

Figure 1:
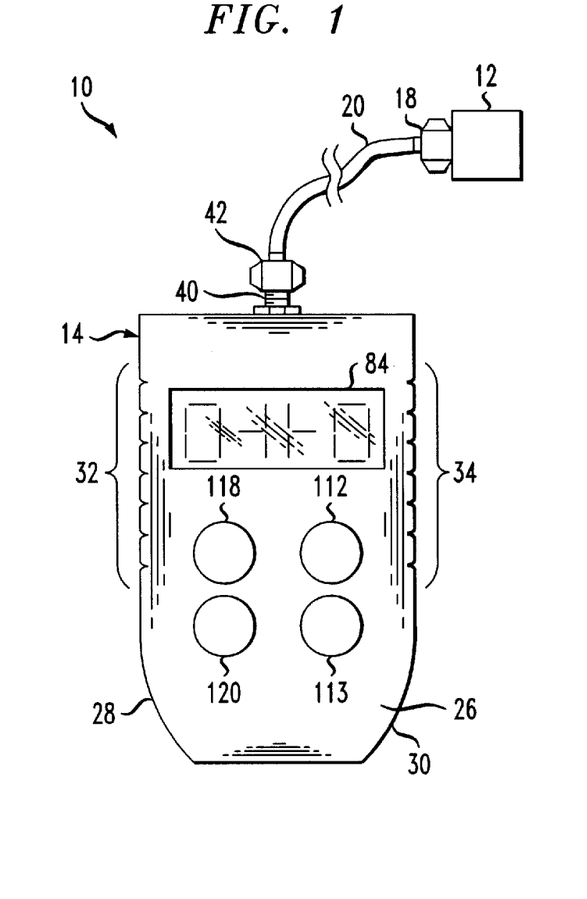
FIG. 1 is a front view of the present invention showing a tester housing attached to one end of a coaxial cable and a terminator plug attached to the other end of the cable.
Figure 2:
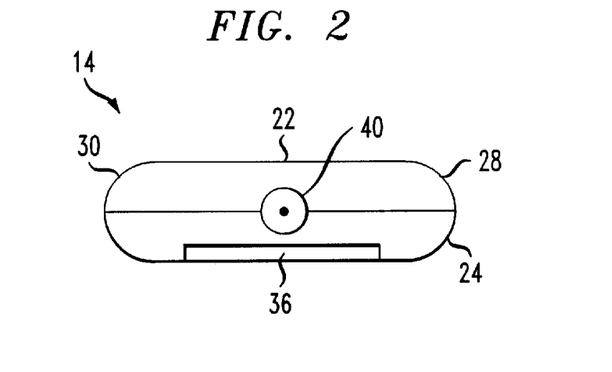
FIG. 2 is a top view of the tester housing of FIG. 1 with the coaxial cable removed.
Figure 3:
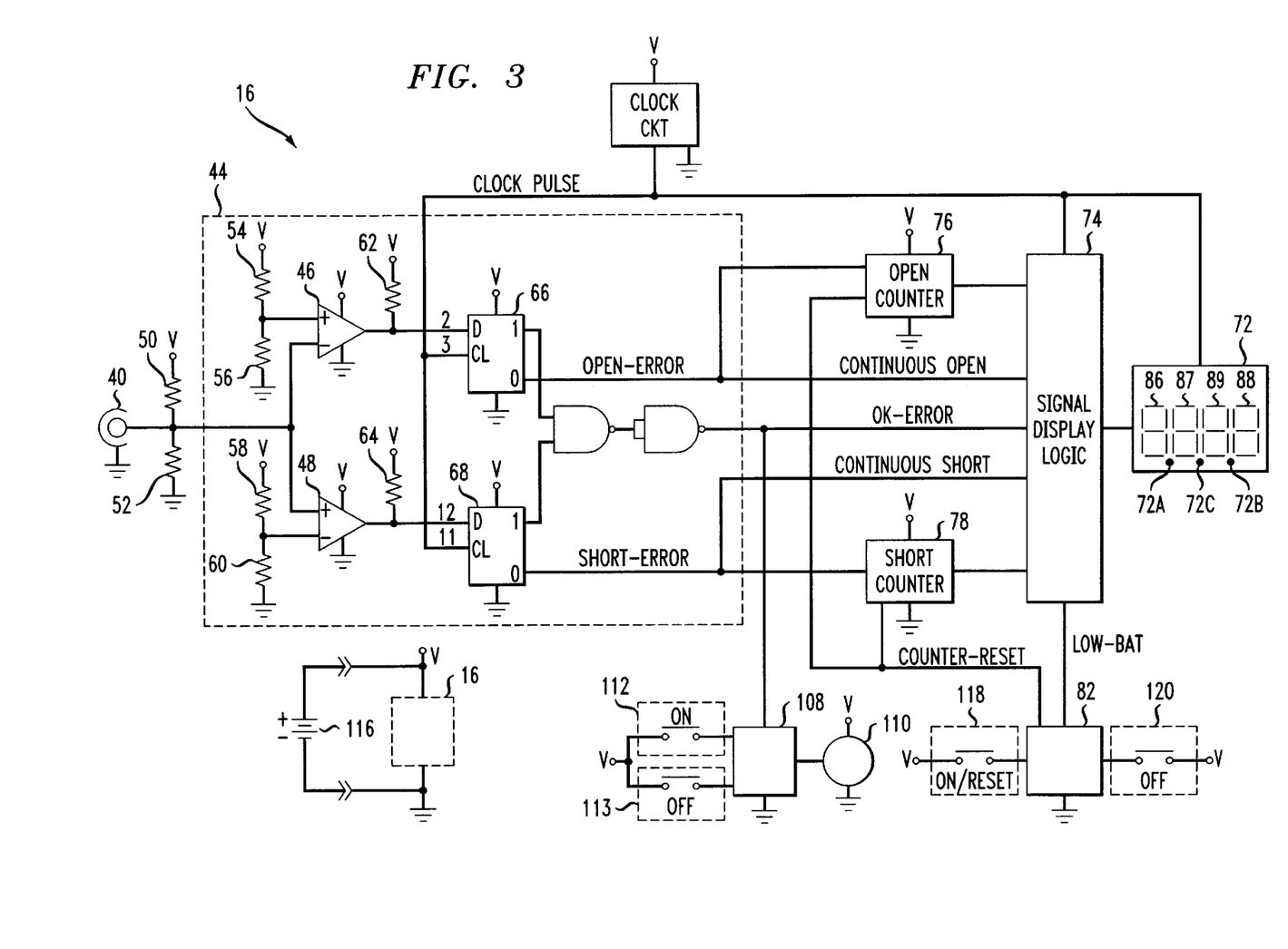
FIG. 3 is a schematic diagram of a currently preferred embodiment of a tester constructed in accordance with the principles of the present invention.

With reference to FIG. 3, the electronic testing circuit 16 is disposed within the tester housing 14 on a circuit broad (not shown). The electronic testing circuit 16 includes a cable connector 40. The cable connector 40 extends from the tester housing 14 and connects to a second coaxial cable connector 42 that is attached to a second end of the coaxial cable 20 as shown in FIG. 1. It is to be understood that the connectors can be coupled using threads, bayonet components or other appropriate connector technology. The electronic testing circuit 16 includes a test circuit 44. The test circuit 44 is coupled to the cable connector 40. The test circuit 44 detects faults and generates one of three characteristic signals for the detected fault conditions. A first characteristic signal or OPEN-ERROR indicates that an open circuit condition has been detected at the cable connector 40. A second characteristic signal or SHORT-ERROR indicates that a short circuit condition has been detected at the cable connector 40. A third characteristic signal or OKAY-ERROR indicates that the coaxial cable 20 coupled to the cable connector 40 at one end and coupled at the opposite end with the terminator plug 12 has no intermittent or continuous shorts or opens.

The test circuit 44 includes two operational amplifiers 46 and 48 coupled to the cable connector 40. The operational amplifiers 46 and 48 are commercially available, for example a LM 339 dual OP AMP integrated circuit was used in a working embodiment of the present invention, and are operated in a comparator mode of operation to generate the above-mentioned three characteristic signals. Resistors 50–64 configure the operational amplifiers 46 and 48 to generate output signals characteristic of the impedance seen at the cable connector 40. The output signals from the operational amplifiers 46 and 48 are fed to associated flip-flop circuits 66 and 68, which are commercially available D flip-flops as illustrated. The flip-flop circuits 66 and 68 have set and reset output states "1" and "0", respectively, with the signals generated by the operational amplifiers 46 and 48 entering their associated flip-flop circuit 66 and 68 on the D lead to be clocked into the flip-flop circuits 66 and 68 by a clock signal generated by a clock circuit 70.

When the flip-flop circuit 66 changes to the set output state "1" it provides a pulse signal that an open fault has been sensed by its associated operational amplifier 46. Similarly, when the flip-flop 68 changes to the set output state "1" it provides a pulse signal that a short fault has been sensed by its associated operational amplifier 48. The flip-flop circuits 66 and 68 are "reset" if the faults are transient such that the inputs to the D-inputs of the flip-flops represent a "0" state which is then clocked into the flip-flops by a clock pulse generated by the clock circuit 70. For transient faults, the output states of the flip-flop circuits are thus changed from the "0" to "1" state for each fault detected so that transient faults can be counted.

The clock circuit 70 generates clock pulses at an adjustable frequency, for example 70 hz was selected for a working embodiment. For this clock speed, transient errors on the order of 14 milliseconds can be detected and counted. The clock circuit 70 is formed from a commercially available 555 timer in a known manner with the frequency of clock pulses being adjustable through conventional timer adjustment circuitry consisting of resistors and capacitors (not shown). As shown in FIG. 3, the clock pulses are fed to the flip-flop circuits 66 and 68 as clocking signals, and to both a display 72 and a signal display logic circuit 74. A discussion of both the display 72 and the signal display logic circuit 74 is provided hereafter.

Binary counters 76 and 78 are also included in the electronic testing circuit 16. As illustrated, the binary counters 76 and 78 each comprise a commercially available CD4029 binary counter integrated circuit although other counter circuits can be used in the present invention. The input of the binary counters 76 and 78 are coupled to the respective set outputs "1" of the flip-flop circuits 66 and 68. The count of the binary counters 76 and 78 are advanced one count for each pulse received from their respective flip-flop circuits 66 and 68. The binary counters 76 and 78 are reset to a preset level or logical "0" by a signal or logical "1" received on their reset inputs. The binary counts of the binary counters 76 and 78 are coupled to the signal display logic circuit 74.

The binary counts from the binary counters 76 and 78 are decoded by the signal display logic circuit 74 and displayed as a decimal number on the display 72. Preferably, the signal display logic circuit 74 is formed of a 4511 IC to decode the binary counts. The signal display logic circuit 74 also comprises a set of exclusive OR gate circuits, such as commercially available CD4030, in order to generate, in addition to the decimal counts of the binary counters 76 and 78, display indications 80 tabulated in FIG. 4. It is to be appreciate that a separate signal line from each flip-flip 66 and 68 is fed directly to an exclusive OR gate of the signal display logic in order to provide a continuous open and continuous short display indications 92, 94 and 96 when detected. Further, it is to be appreciated that the resulting display indications 80 shown on the display 72 are based on clock pulses from the clock circuit 70, the outputs of the counters 76 and 78, and a power management circuit 82. A discussion of the power management circuit 82 is provided later after a further discussion of the output of the signal display logic 74, which follows.

The output of the signal display logic circuit 74 is fed to the display 72 which is visible to a user through a window 84, made of clear plastic, provided in the upper portion 22 of the tester housing 14, see FIG. 1. Preferably, the display 72 is formed of a commercially available quad 7-segment display having three decimal points. A "short" seven segment display 86 for displaying detected shorts and an "open" seven segment display 88 for displaying detected opens both of which can display a single number of "0","1","2","3", "4","5","6","7", or "8" based upon receipt of display signals from the signal display logic circuit 74. If the number of faults detected exceeds eight, the binary counters 76 and 78 are configured to remain at a maximum count of "8" or alternately, the signal display logic circuit 74 is configured to display an "8" for all counts equal to or greater than eight.

Figure 4:
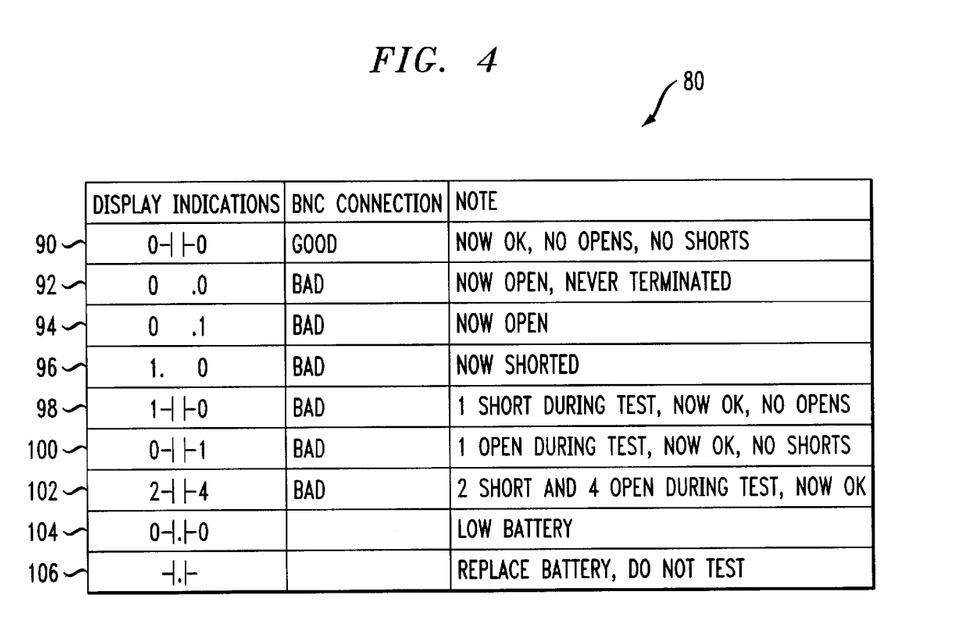
FIG. 4 is a tabulation illustrating examples of display indications in accordance with the principles of the present invention.

The display of an integer number of "0" in both the short seven segment display 86 and the open seven segment display 88 indicates that the coaxial cable connectors 18 and 42 coupled to the coaxial cable 20 have no opens and no shorts. As illustrated in FIG. 4, a display indication 90 of the "0" integer numbers in both the short seven segment display 86 and the open seven segment display 88 along with the symbol "-| |-" (representing a +) in the middle two seven segment displays 87 and 89 indicates that the coaxial cable connection is good. All other display indications 92–102 tabulated in FIG. 4, along with the open count or the short count or both, other than a low battery warning 104 and a replace battery warning 106, indicate a bad coaxial cable connection. The three decimal points 72A, 72B, 72C of the display 72 are used to indicate the current test status with the leftmost decimal point 72A being displayed when a short fault condition is currently being detected, the rightmost decimal point 72B being displayed when an open fault condition is currently being detected and the middle decimal point 72C being flashed for indication of a low battery/replace battery warning.

In addition to providing the visual display indications 80 of FIG. 4, the electronic testing circuit 16 can provide an audible warning by a buzzer circuit 108 with a buzzer 110. The buzzer 110 sounds whenever the third characteristic signal or OKAY-ERROR signal passed to the buzzer circuit 108 from the signal generator circuit 44 changes to a fault detect signal. A buzzer on switch 112 and a buzzer off switch 113, preferably two commercially available membrane switches incorporated into a face cover for the testing device 10, are provided to give the user the option of turning the buzzer on or off. It is to appreciated that a single buzzer on/off switch could be used if desired.

A battery 116 is disposed within the tester housing 14 for supplying electrical energy to the electronic testing circuit 16. The battery 116 is removably accessible through the removable door 36 of the tester housing 14. The battery 116 is conventional in design, commercially available, and preferably comprises two AA lithium batteries to provide 3 volts to the electronic testing circuit 16.

The above-mentioned power management circuit 82 is included in the electronic testing circuit 16 and is coupled to the battery 116 to provide control of power to the electronic testing circuit 16. The power management circuit 82 consists of first and second switches 118 and 120, preferably two commercially available membrane switches incorporated into the face cover for the testing device 10. The first switch 118 of the power management circuit 82 is used to turn the electronic testing circuit 16 on and to send a reset signal to the counters 76 and 78 at initialization and every time the first switch 118 is pressed. The second switch 120 of the power management circuit 82 is used to turn the electronic testing circuit 16 off. It is to be appreciated that a single power on/off switch could be used if desired.

Additionally, the power management circuit 82 monitors the voltage of the battery 116. If the voltage of the battery 116 drops below a first threshold voltage, preferably 2.6 volts, the power management circuit 82 will send an oscillating low battery signal to the signal display logic mechanism 74 which causes the display 72 to show the low battery warning by flashing the middle decimal point 72C with the remainder or the display remaining the same. Thus, as shown in FIG. 4, the low battery voltage warning 104, flashing of the middle decimal point 72C, is shown with the remainder of the display showing a good coaxial cable connection display. Of course, any other cable connection display can be displayed with the low battery warning indication. The low battery signal is preferable provided to the signal display logic circuit 74 at a one second oscillation. If the voltage of the battery 116 drops below a second threshold voltage, preferably 2.45 volts, the power management circuit 82 will send a signal to the signal display logic mechanism 74 which causes the display 72 to show the replace battery warning 106 wherein the digit displays are turned off and the middle decimal point 72C continues to flash.

In testing for intermittent or continuous short or open circuits at the coaxial cable connector coaxial cable junction, a user will terminate one end of the coaxial cable 20 to be tested with the terminator plug 12. The user then secures the other end of the coaxial cable 20 to be tested to the cable connector 40. It is to be appreciated that both ends of the coaxial cable have firmly attached coaxial cable connecters. With the coaxial cable connector testing device 10 turned on, the user wiggles one end of the coaxial cable in all directions for a few moments. After wiggling the coaxial cable 20 at one end, the user then checks the display 72 for one of the display indications 80. Next, the user wiggles the other end of the coaxial cable 20 in all directions for a few moments and again checks the display 72. If the coaxial cable 20 is to be re-checked, the user presses the on button once again to reset the coaxial cable connector testing device 10.

With respect to the above description, it is to be appreciated that the optimum dimensional relationships for the parts of the invention, to include variations in size, materials, shape, form, function and the manner of operation, assembly and use, are deemed readily apparent and obvious to one skilled in the art, and all equivalent relationships to those illustrated in the drawings and described in the specification are intended to be encompassed by the present invention.

Having thus described the present invention in detail and by reference to preferred embodiments thereof, it will be apparent that modifications and variations are possible without departing from the scope of the invention detailed in the appended claims.

What is claimed is:

1. A tester for junctions between a coaxial cable and coaxial cable connectors connected to said coaxial cable to test for intermittent and continuous open circuit and short circuit faults at said junctions, said tester comprising:

a cable terminator plug having a characteristic impedance and being coupled to a first end of a coaxial cable whose junctions are to be tested; and an electronic testing circuit having a coaxial cable connector coupled to a second end of said coaxial cable to be tested said electronic testing circuit comprising:

a test circuit coupled to said coaxial cable connector for detecting open and short circuit faults at one or both of said junctions and generating open fault signals indicating detected open circuit faults, short fault signals indicating detected short faults and a no shorts/no opens signal indicating no detected short or open faults;

an open counter coupled to said test circuit for counting said open fault signals;

a short counter coupled to said test circuit for counting said short fault signals; and a display circuit for displaying the counts accumulated in said open counter and said short counter.

2. A tester for junctions between a coaxial cable and coaxial cable connectors as claimed in claim 1 wherein said display circuit is a quad seven segment LCD.

3. A tester for junctions between a coaxial cable and coaxial cable connectors as claimed in claim 1 electronic testing circuit is accommodated in a tester housing having a window for viewing said display circuit, and a removable door to insert or remove a power supply battery also accommodated in said tester housing.

4. A tester for junctions between a coaxial cable and coaxial cable connectors as claimed in claim 1 wherein said test circuit comprises:

a first comparator coupled to said coaxial cable connector for detecting said open circuit faults;

a first storage device responsive to said open circuit faults for generating said open fault signals;

a second comparator coupled to said coaxial cable connector for detecting said short circuit faults;

a second storage device responsive to said short circuit faults for generating said short fault signals; and combination circuitry coupled to said first and second storage devices for generating said no shorts/no opens signal.

5. A tester for junctions between a coaxial cable and coaxial cable connectors as claimed in claim 4 wherein said storage devices comprise flip-flop circuits.

6. A tester for junctions between a coaxial cable and coaxial cable connectors as claimed in claim 1 further comprising an audible sounder circuit which generates an audible indication if either said open fault signals or said short fault signals are generated.

7. A tester for junctions between a coaxial cable and coaxial cable connectors as claimed in claim 6 wherein said audible sounder circuit comprises a buzzer.

8. A tester for junctions between a coaxial cable and coaxial cable connectors as claimed in claim 7 wherein said audible sounder circuit further comprises an on switch and an off switch to turn said buzzer on and off, respectively.

9. A tester for junctions between a coaxial cable and coaxial cable connectors as claimed in claim 1 further comprises:
 a battery with said tester being powered by said battery; and
 a power management circuit for controlling power coupled from said battery to said electronic testing circuit.

10. A tester for junctions between a coaxial cable and coaxial cable connectors as claimed in claim 9 wherein said power management circuit further monitors power of said battery and generates visual warning displayed by said display circuit if a low power condition exists.

11. A tester for junctions between a coaxial cable and coaxial cable connectors as claimed in claim 10 wherein said power management circuit provides a first low power warning if said power is detected below a first threshold level and a second lower power warning if said power is detected below a second threshold level.

12. A tester for junctions between a coaxial cable and coaxial cable connectors as claimed in claim 11 wherein said first threshold level is approximately 2.6 volts and said second threshold level is approximately 2.45 volts.

13. A tester for junctions between a coaxial cable and coaxial cable connectors as claimed in claim 9 wherein said power management circuit comprises an on switch and an off switch, and wherein pressing said on switch sets said open counter to a preset value and sets said short counter to a preset level.

14. A tester for junctions between a coaxial cable and coaxial cable connectors as claimed in claim 13 wherein said preset value for said open counter is equal to zero.

15. A tester for junctions between a coaxial cable and coaxial cable connectors as claimed in claim 13 wherein said preset value for said short counter is equal to zero.

16. A method for testing junctions between a coaxial cable and coaxial cable connectors connected to said coaxial cable for intermittent and continuous open circuit and short circuit faults at said junctions, said method comprising the steps of:
 coupling a cable terminator plug having a characteristic impedance to a first end of a coaxial cable whose junctions are to be tested; and
 coupling an electronic testing circuit having a coaxial cable connector to a second end of said coaxial cable to be tested by performing the steps of:
  coupling a test circuit to said coaxial cable connector to detect open and short circuit faults at one or both of said junctions and to generate open fault signals indicating detected open circuit faults, short fault signals indicating detected short faults and a no shorts/no opens signal indicating no detected short or open faults;
  coupling an open counter to said test circuit for counting said open fault signals;
  coupling a short counter to said test circuit for counting said short fault signals; and
  displaying the counts accumulated in said open counter and said short counter.

17. A method for testing junctions between a coaxial cable and coaxial cable connectors as claimed in claim 16 further comprising the steps of:
 providing a battery to power testing;
 monitoring power of said battery; and
 generating a visual warning displayed by a display circuit if a low power condition exists.

18. A method for testing junctions between a coaxial cable and coaxial cable connectors as claimed in claim 17 wherein said step of generating a visual warning comprises the steps of:
 providing a first low power warning if said power is detected below a first threshold level; and
 providing a second lower power warning if said power is detected below a second threshold level.

19. A method for testing junctions between a coaxial cable and coaxial cable connectors as claimed in claim 16 further comprising the steps of:
 providing an audible sounder circuit; and
 activating said audible sounder circuit to generate an audible indication if either said open fault signals or said short fault signals are generated.

* * * * *

UNITED STATES PATENT AND TRADEMARK OFFICE
CERTIFICATE OF CORRECTION

PATENT NO. : 6,344,748 B1
DATED : February 5, 2002
INVENTOR(S) : Joseph R. Gannon It is certified that error appears in the above-identified patent and that said Letters Patent is hereby corrected as shown below:

Column 1,
Line 36, "above describe" should read -- above described --.

Column 2,
Line 57, "indicated" should read -- indicate --.

Column 3,
Line 45, "A an open" should read -- An open --.
Line 66, "to provided" should read -- to provide --.

Column 4,
Line 3, "to provided" should read -- to provide --.
Line 26, "drawings which shows" should read -- drawings which show --.
Line 50, "10 kilo" should read -- 10 kilo --.

Column 5,
Line 4, "circuit broad" should read -- circuit board --.

Column 6,
Line 24, "appreciate" should read -- appreciated --.

Column 7,
Line 35, " to appreciated" should read -- to be appreciated --.
Line 44, "remainder or the display" should read -- remainder of the display --.
Line 50, "preferable provided" should read -- preferably provided --.

UNITED STATES PATENT AND TRADEMARK OFFICE
CERTIFICATE OF CORRECTION

PATENT NO.   : 6,344,748 B1
DATED        : February 5, 2002
INVENTOR(S)  : Joseph R. Gannon

It is certified that error appears in the above-identified patent and that said Letters Patent is hereby corrected as shown below:

<u>Column 8,</u>
Line 49, "claim 1 electronic" should read -- claim 1 wherein said electronic --.

Signed and Sealed this

Thirtieth Day of July, 2002

*Attest:*

*Attesting Officer*

JAMES E. ROGAN
*Director of the United States Patent and Trademark Office*